US009331706B1

(12) United States Patent
Ranjbar

(10) Patent No.: US 9,331,706 B1
(45) Date of Patent: *May 3, 2016

(54) HIGH-SPEED ANALOG-TO-DIGITAL CONVERSION SYSTEM WITH FLASH ASSISTED PARALLEL SAR ARCHITECTURE

(71) Applicant: INPHI CORPORATION, Santa Clara, CA (US)

(72) Inventor: Mohammad Ranjbar, San Jose, CA (US)

(73) Assignee: INPHI CORPORATION, Santa Clara, CA (US)

( * ) Notice: Subject to any disclaimer, the term of this patent is extended or adjusted under 35 U.S.C. 154(b) by 98 days.

This patent is subject to a terminal disclaimer.

(21) Appl. No.: 14/511,074

(22) Filed: Oct. 9, 2014

Related U.S. Application Data

(63) Continuation of application No. 14/086,925, filed on Nov. 21, 2013, now Pat. No. 8,884,801.

(51) Int. Cl.
*H03M 1/06* (2006.01)
*H03M 1/00* (2006.01)

(52) U.S. Cl.
CPC ............ *H03M 1/0609* (2013.01); *H03M 1/002* (2013.01)

(58) Field of Classification Search
CPC ....... H03M 1/357; H03M 1/124; H03M 1/28; H03M 1/215
USPC .......... 341/155, 156, 144, 163, 172, 118, 120
See application file for complete search history.

(56) References Cited

PUBLICATIONS

Jiren Yuan et al., "A 10-bit 5-MS/s Successive Approximation ADC Cell Used in a 70-MS/s ADC Array in 1.2-μm CMOS", IEEE Journal of Solid-State Circuits, Aug. 1994, pp. 866-872, vol. 29, Issue 8.
Thomas P. Redfern et al., "A Monolithic Charge-Balancing Successive Approximation A/D Technique", IEEE Journal of Solid-State Circuits, Dec. 1979, pp. 912-920, vol. 14, Issue 6.
Stephen H. Lewis et al., "A Pipelined 5-Msample/s 9-bit Analog-to-Digital Converter", IEEE Journal of Solid-State Circuits, Dec. 1987, pp. 954-961, vol. 22, Issue 6.
Thierry Masson, "A 0.8 Watts, 10 Bits/20MHz CMOS Flash Converter based on an Original Technic Called Cyclic * Auto-zero", Sixteenth European Solid-State Circuits Conference ESSCIRC '90, 1990, pp. 121-124.

*Primary Examiner* — Peguy Jean Pierre
(74) *Attorney, Agent, or Firm* — Richard T. Ogawa; Ogawa P.C.

(57) ABSTRACT

The present invention is directed to signal processing systems and methods thereof. In various embodiments, the present invention provides an analog-to-digital conversion (ADC) system that includes a flash ADC portion and a time-interleaved parallel SAR portion. For an n-bit ADC process, the flash ADC portion converts k MSBs of the n bits during a single cycle, and the SAR portion converts n–k LSBs in m number of cycles. The SAR portion includes a number of SAR channels that perform A/D conversion in parallel, and the k MSB from the course flash converter is verified for errors by the SAR portion and allows a net saving of the power consumption by reducing the number of fine resolution SARs. There are other embodiments as well.

18 Claims, 5 Drawing Sheets

| S&H #1 | S&H #2 | Flash A/D | | SAR #1 | | SAR #2 | | SAR #3 | | SAR #4 | | SAR #5 | | SAR #6 | | MUX |
|---|---|---|---|---|---|---|---|---|---|---|---|---|---|---|---|---|
| odd | even | vin | dig out | vin | dig out | vin | dig out | vin | dig out | vin | dig out | vin | dig out | vin | dig out | dig out |
| 0.4155 | x | 0.4155 | 1011 | 0.4155 | 11110111 | x | x | x | x | x | x | x | x | x | x | 11110111 |
| x | -0.7485 | -0.7485 | 0010 | x | erc=0 | -0.7485 | 11001000 | x | x | x | x | x | x | x | x | 11001000 |
| -0.8263 | x | -0.8263 | 0001 | x | x | x | erc=0 | -0.8263 | 00110000 | x | x | x | x | x | x | 00110000 |
| x | 0.2949 | 0.2949 | 1010 | x | x | x | x | x | erc=0 | 0.2949 | 00001011 | x | x | x | x | 00001011 |
| 0.9882 | x | 0.9882 | 1111 | x | x | x | x | x | x | x | erc=0 | 0.9882 | 10001111 | x | x | 10001111 |
| x | 0.2475 | 0.2475 | 1010 | x | x | x | x | x | x | x | x | x | erc=0 | 0.2475 | 11111101 | 11111101 |
| -0.8524 | x | -0.8524 | 0001 | -0.8524 | 10110101 | x | x | x | x | x | x | x | x | x | erc=1 | 10110101 |
| x | -0.7154 | -0.7154 | 0010 | x | erc=0 | -0.7154 | 00100000 | x | x | x | x | x | x | x | x | 00100000 |
| 0.4596 | x | 0.4596 | 1100 | x | x | x | erc=1 | 0.4596 | 00010110 | x | x | x | x | x | x | 00010110 |
| x | 0.9677 | 0.9677 | 1111 | x | x | x | x | x | erc=1 | 0.9677 | 10100101 | x | x | x | x | 10100101 |
| 0.0716 | x | 0.0716 | 1001 | x | x | x | x | x | x | x | erc=0 | 0.0716 | 11111110 | x | x | 11111110 |
| x | -0.9284 | -0.9284 | 0001 | x | x | x | x | x | x | x | x | x | erc=1 | -0.9284 | 10011111 | 10011111 |
| -0.5812 | x | -0.5812 | 0011 | -0.5812 | 00010010 | x | x | x | x | x | x | x | x | x | erc=1 | 00010010 |
| x | 0.6094 | 0.6094 | 1101 | x | erc=0 | 0.6094 | 00100100 | x | x | x | x | x | x | x | x | 00100100 |
| 0.9158 | x | 0.9158 | 1111 | x | x | x | erc=1 | 0.9158 | 10111010 | x | x | x | x | x | x | 10111010 |
| x | -0.1067 | -0.1067 | 0111 | x | x | x | x | x | erc=1 | -0.1067 | 11111011 | x | x | x | x | 11111011 |
| -0.9743 | x | -0.9743 | 0000 | x | x | x | x | x | x | x | erc=1 | -0.9743 | 10001001 | x | x | 10001001 |
| x | -0.4281 | -0.4281 | 0101 | x | x | x | x | x | x | x | x | x | erc=1 | -0.4281 | 00001001 | 00001001 |
| 0.7393 | x | 0.7393 | 1110 | 0.7393 | 00110101 | x | x | x | x | x | x | x | x | x | erc=1 | 00110101 |
| x | 0.8340 | 0.8340 | 1111 | x | erc=0 | 0.8340 | 11001110 | x | x | x | x | x | x | x | x | 11001110 |

HIGH-SPEED ANALOG-TO-DIGITAL CONVERSION SYSTEM WITH FLASH ASSISTED PARALLEL SAR ARCHITECTURE

CROSS-REFERENCES TO RELATED APPLICATIONS

The present application claims priority to and is a continuation of U.S. patent application Ser. No. 14/086,925, filed on Nov. 21, 2013, and is incorporated herein in its entirety for all purposes.

STATEMENT AS TO RIGHTS TO INVENTIONS MADE UNDER FEDERALLY SPONSORED RESEARCH AND DEVELOPMENT

Not Applicable

REFERENCE TO A "SEQUENCE LISTING," A TABLE, OR A COMPUTER PROGRAM LISTING APPENDIX SUBMITTED ON A COMPACT DISK

Not Applicable

BACKGROUND OF THE INVENTION

The present invention is directed to signal processing systems and methods thereof.

We live in an analog world, and communication media are analog. Computers and data communication operate in a digital world. To work with computers and data communication networks, constant conversions between analog and digital are a way of life. Speed, accuracy, and efficiency, are criteria on which conversion algorithms and systems are measured.

Over the past, various types of conversion systems and methods have been implemented. Unfortunately, conventional systems and methods have been inadequate, as explained below. Improved conversion systems and methods are desired.

SUMMARY OF INVENTION

The present invention is directed to signal processing systems and methods thereof. In various embodiments, the present invention provides an analog-to-digital conversion (ADC) system that includes a flash ADC portion and a time-interleaved SAR portion. For an n-bit ADC process, the flash ADC portion converts k MSBs of the n bits during a single cycle, and the SAR portion converts n−k LSBs in m number of cycles, where m is equal to n−k+2. The SAR portion includes a number of SAR channels that perform ADC in parallel, and perform an error check and correction on the k bit MSB output of the flash portion. There are other embodiments as well.

BRIEF DESCRIPTION OF THE DRAWINGS

FIG. 5 is a table illustrating operation of an ADC system according to an embodiment of the present invention.

DETAILED DESCRIPTION OF THE INVENTION

Figure 1:
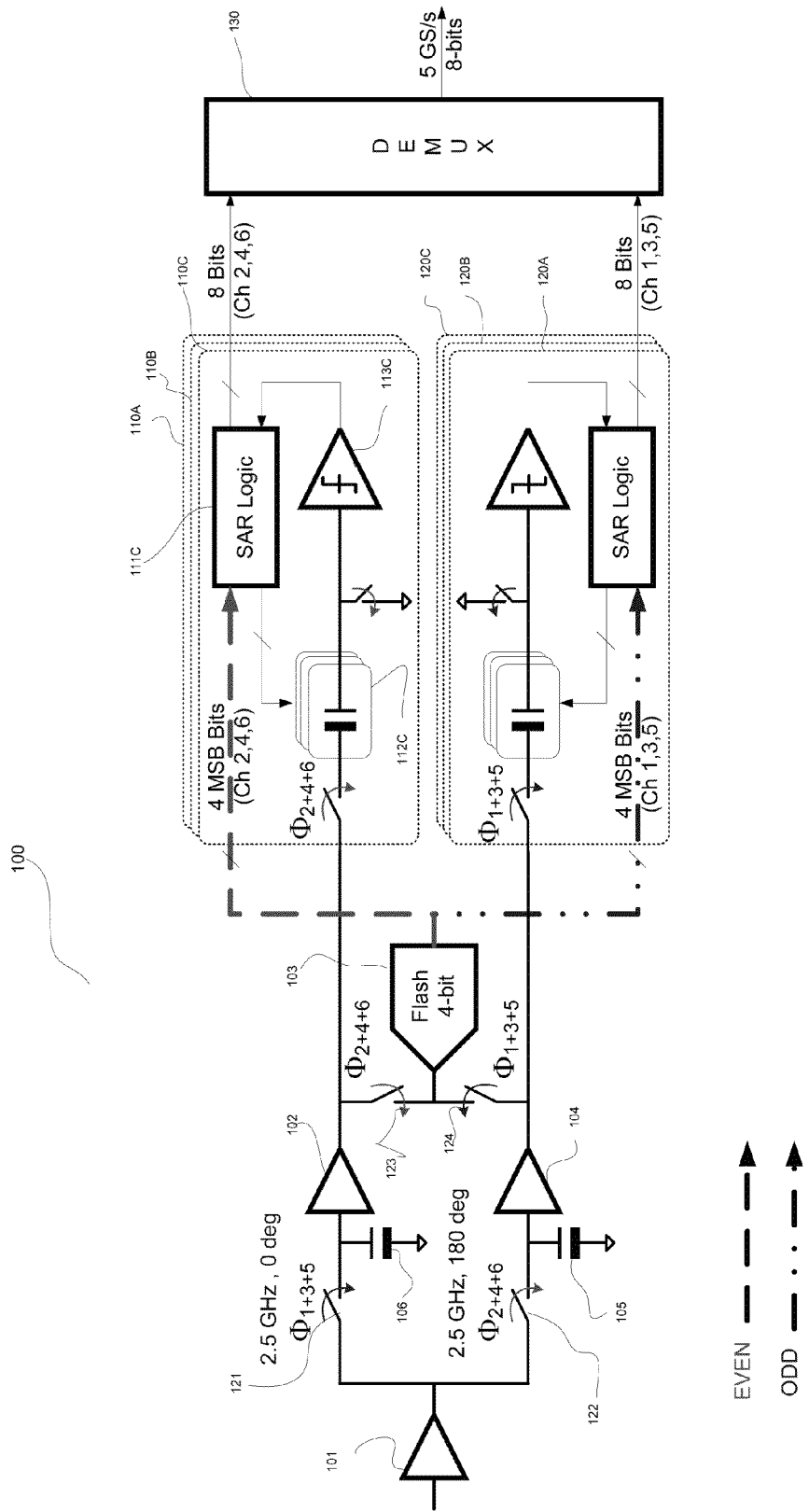
FIG. 1 is a simplified block diagram illustrating an 8-bit ADC system 100 according to an embodiment of the present invention.

The present invention is directed to signal processing systems and methods thereof. More specifically, embodiments of the present invention provide a system that uses both flash ADC and SAR logics to perform analog-to-digital conversion. Flash ADC performs the coarse analog-to-digital (A/D) conversion and is configured with a special offset that is intended for error correction. The SAR logics provide error correction of Flash output and perform fine A/D conversion. The analog-to-digital conversion systems according to embodiments of the present invention are accurate and power efficient.

Analog-to-digital converters (or "ADC") have a wide range of applications, such as digital signal processing, data communication, audio, video, and others. For example, in the data communication field, digital information is often converted to analog signals to allow transmission over analog mediums and then converted back to digital signals, and as a result, digital-to-analog converters (or "DAC") and ADCs are essential components of communication systems. With advent of mobile devices and data farms, it is essential that DAC and ADC devices be fast, accurate, and energy efficient. More specifically, mobile devices require low power consumption that enables long operating and standby time. For servers and communication devices at data farms, power efficiency is also important, as energy consumption becomes expensive when thousands of devices are operating, and energy inefficiency translates to excessive heat generation.

In conventional architectures, analog to digital conversion can be performed using flash ADC architecture or SAR architecture. Flash ADC, or sometimes referred to as direct conversion ADC, is a type of analog-to-digital converter that uses a linear voltage ladder with a comparator at each "rung" of the ladder to compare the input voltage to successive reference voltages. For example, the ladders are typically constructed of many resistors, and in modern implementations, capacitive voltage division is sometimes used also. The output of these comparators is generally fed into a digital encoder which converts the inputs into a binary value (the collected outputs from the comparators can be thought of as a unary value). The resolution of a flash ADC comparator is based on the number of comparator used. For example, a flash ADC with n-bits resolution uses $2^n$ comparators for 1 clock cycle determination. Consequently, a resolution based on $2^n$ comparators (i.e., for n bits, needs $2^n$ comparators) requires a lot of power due to the $2^n$ number of comparators.

In contrast, SAR architecture, in comparison to flash ADC architecture, is relatively power efficient. SAR performs ADC by using a binary search through all possible quantization levels before finally converging upon a digital output for each conversion. To perform an n bit ADC conversion, a SAR may only need one comparator, but for an n-bit conversion, n clock cycles are needed. As a result, an n-bit SAR conversion uses fewer comparators than an n-bit flash ADC, but the n-bit SAR is much slower. SAR essentially performs serial data comparison, and with one conversion and binary division at each clock cycle, where the binary division increases the resolution at each clock cycle.

Both the flash ADC and the SAR architectures have their advantages and limitations. Depending on the specific application and needs, flash ADC architecture is often selected for processing speed, and SAR architecture is typically selected for its low power consumption. It is to be appreciated that according to various embodiments of the present invention, flash ADC and SAR, at different resolution levels, are used in conjunction to provide both high processing speed and high power efficiency.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

FIG. 1 is a simplified block diagram illustrating an 8-bit ADC system 100 according to an embodiment of the present invention. This diagram is merely an example, which should not unduly limit the scope of the claims. One of ordinary skill in the art would recognize many variations, alternatives, and modifications. It is to be appreciated that the ADC system 100 merely provides an example, and ADC systems at different resolutions (e.g., 6 bits, 10 bits, 12 bits, 14 bits, etc.) can be implemented similar to the ADC system 100. Depending on the specific implementation, different numbers of flash ADC and SAR blocks can be used.

It is to be appreciated that in various embodiments, a flash ADC module is used for most significant bits (MSBs). Among other things, the flash ADC is used with multiple SAR modules and by a special treatment of its reference levels enables error correction of the MSBs. For example, the flash ADC utilizes a reference offset value when performing conversion of MSBs, and the offset value is used by the SARs to speed up the error correction process. Moreover, with flash ADC performing part of the conversion process and the SARs perform another, the accuracy of the ADC system is improved and the settling requirements during the conversion phase is relaxed, afforded by the initial guess by the flash ADC and relaxed error recovery of the SAR comparators due to smaller step size. It is to be appreciated that compared to a pure SAR structure of comparable resolution, ADC systems according to embodiments of the present invention are faster. Compared to a pure flash ADC structure of comparable resolution, ADC systems according to embodiments of the present invention are more energy efficient. It is to be appreciated that benefits of power efficiency and computational speeds of ADC systems is only afforded by the implementations according to the present invention; simple combination of flash ADC and SARs would not provide energy savings or computation speed gains achieved according to the present invention. More specifically, ADC systems according to the present invention can perform ADC conversion in fewer conversion cycles compared to an SAR. For example, a specific embodiment of the present invention performs an 8-bit conversion in 6 conversion cycles, whereas an SAR architecture would need 9 cycles. For an 8-bit conversion, a conventional two-bit per step SAR architecture can be implemented to require 5 cycles, however requires 3 times the number of SAR-DACs and comparators, which translates to higher power consumptions and decreased energy efficiency. In addition, 2-bit SARs are also vulnerable to SAR mismatch problems.

In various embodiments, SAR channels (e.g., as show in FIG. 1) are calibrated to provide control gain and offset mismatch among the SAR channels. For example, the plurality of SAR channels (and specifically their respective comparators) is calibrated. Depending on the specific implementation, various components, such as the comparators, are matched to provide good performance. Also, the flash ADC provides improved INL/DNL matching among back-end sub-SAR which is important for reducing the spurious tones in the output spectrum which can result from mismatch between SAR channels. Among other benefits, the flash ADC affords improved INL/DNL matching.

It is to be appreciated comparators in ADC architectures contribute to most of the power consumption. By interleaving channels as shown in FIG. 1, and provide reference offset of Flash ADC in single direction, both high speed and power efficiency can be obtained. This diagram is merely an example, which should not unduly limit the scope of the claims. One of ordinary skill in the art would recognize many variations, alternatives, and modifications. The ADC structure 100 in FIG. 1 is configured with an 8-bit resolution, where a 4-bit flash ADC 103 is implemented with six SAR channels. It is to be appreciated the other resolutions (e.g., G-bit, 10-bit, 12-bit, 14-bit, etc.) can be implemented as well. Additionally, the number of SAR channels can be changed depending on the implementation.

As shown in FIG. 1, a "ping-pong" structure is provided at the input stage. More specifically, input received at node 101 into two paths based on sampling phases. Switches 121 and 124, and the capacitor 106 provides sampling and holds sampled value during odd sampling phases (i.e., $\Phi_{1,\ 3,\ 5}$). During the odd phases, the analog value is processed by the flash ADC 103 and the odd channels (i.e., channels 120A, 120B, or 120C). Similarly, switches 122 and 123, and the capacitor 105 provides sampling and holds sampled value during even sampling phases (i.e., $\Phi_{2,\ 4,\ 6}$). During the even phases, the analog value is processed by the flash ADC 103 and the even channels (i.e., channels 110A, 110B, or 110C). It is to be appreciated that the "ping-pong" process between odd and even channels improves sampling quality without sacrificing sampling speed. For example, both odd and even sampling circuitries can sample a single analog value over two-phases; odd sampling circuitry has one phase of breathing room while the even sampling circuit is sampling, and vice versa.

Figure 2:
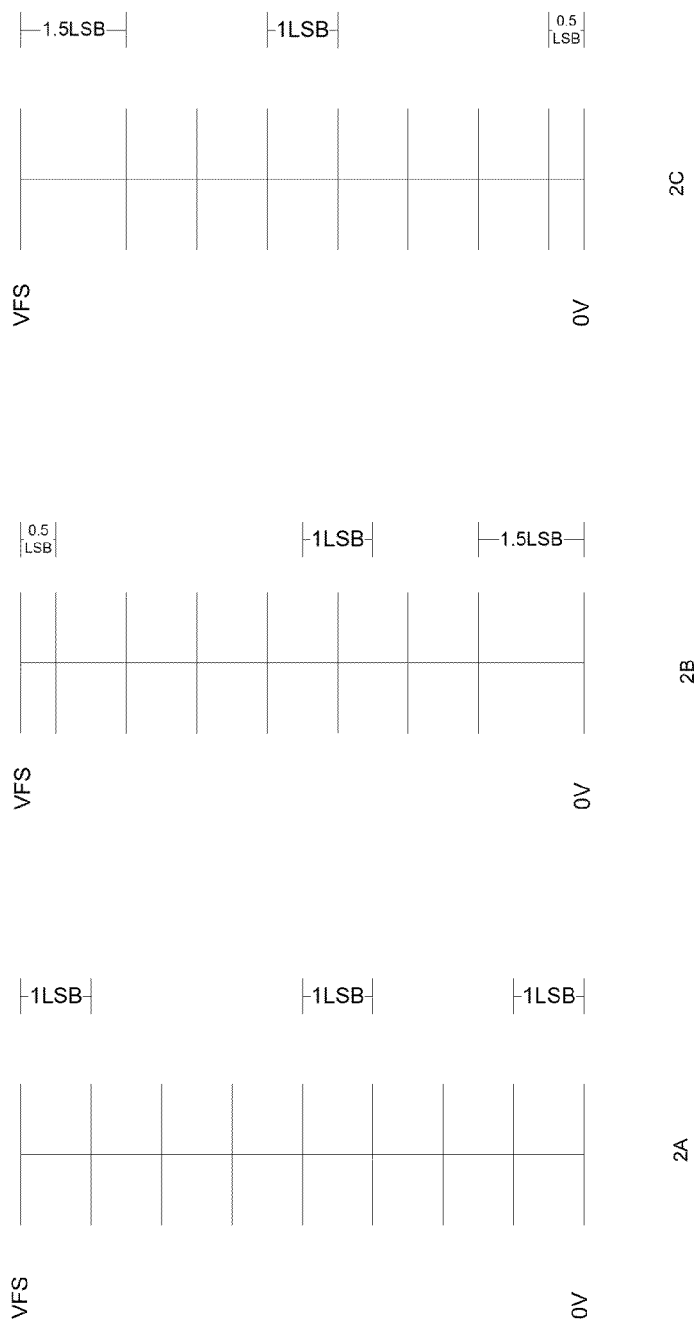
FIG. 2 is a simplified diagram illustrating comparison reference values used by flash ADC according to embodiments of the present invention.

The flash ADC 103, as explained above, provides reference error correction that can be used by the SAR channels. FIG. 2 is a simplified diagram illustrating comparison reference values used by flash ADC according to embodiments of the present invention. This diagram is merely an example, which should not unduly limit the scope of the claims. One of ordinary skill in the art would recognize many variations, alternatives, and modifications. Reference values of the flash ADC, among other things, facilitate error correction for the SAR channels. In various embodiments, the flash ADC 103 is configured with a predetermined offset added to the reference values which makes the reference levels look asymmetrical. Typically, reference values for conventional flash ADC are symmetrical and even, as shown in 2A. For example, between 0V and $V_{FS}$, there are $2^k$ steps, where each step occupies about $V_{FS}/2^k$ Volts, equivalent to 1 LSB (of the flash ADC 103, or in this particular case, the 4 MSBs), and the reference levels are evenly spaced. With asymmetrical (e.g., shifted in a single direction) reference levels used by the flash ADC 103, are different from symmetrical case. For example, the spacing of the flash ADC reference levels may be 1 LSB apart, with the exception of top bits occupying 0.5 LSB and the bottom level occupying 1.5 LSB, as shown in 2B. Similarly, the asymmetry may be reversed, as shown in 2C, where the ADC bits (e.g., in 8 bits conversion) spacing may be 1 LSB apart, with the exception of top most reference occupying 1.5 LSB and the bottom most reference occupying 0.5 LSB. The "shift" of the offset values is predetermined and a known quantity. This predetermined shifted value is used by the SAR channels as reference of forward error correction. The digital conversion value from the flash ADC 103 is used by the conversion process to form a residue signal inside the SAR section that is used for error-correction of the MSB bits as well as extraction of the LSB bits.

Both analog values collected from the input 101 and the digital output of the flash ADC 103 are used by the SAR channels during the conversion process. Each SAR channel, as shown, comprises SAR logic, buffer, comparator, and/or other components. As shown in FIG. 1, the SAR channel 110C comprises SAR logic 111C, buffer 112C, and comparator 113C. For an 8-bit conversion, the SAR channel 110C (e.g., channel 2) performs the conversion process in 6 cycles.

Figure 3:
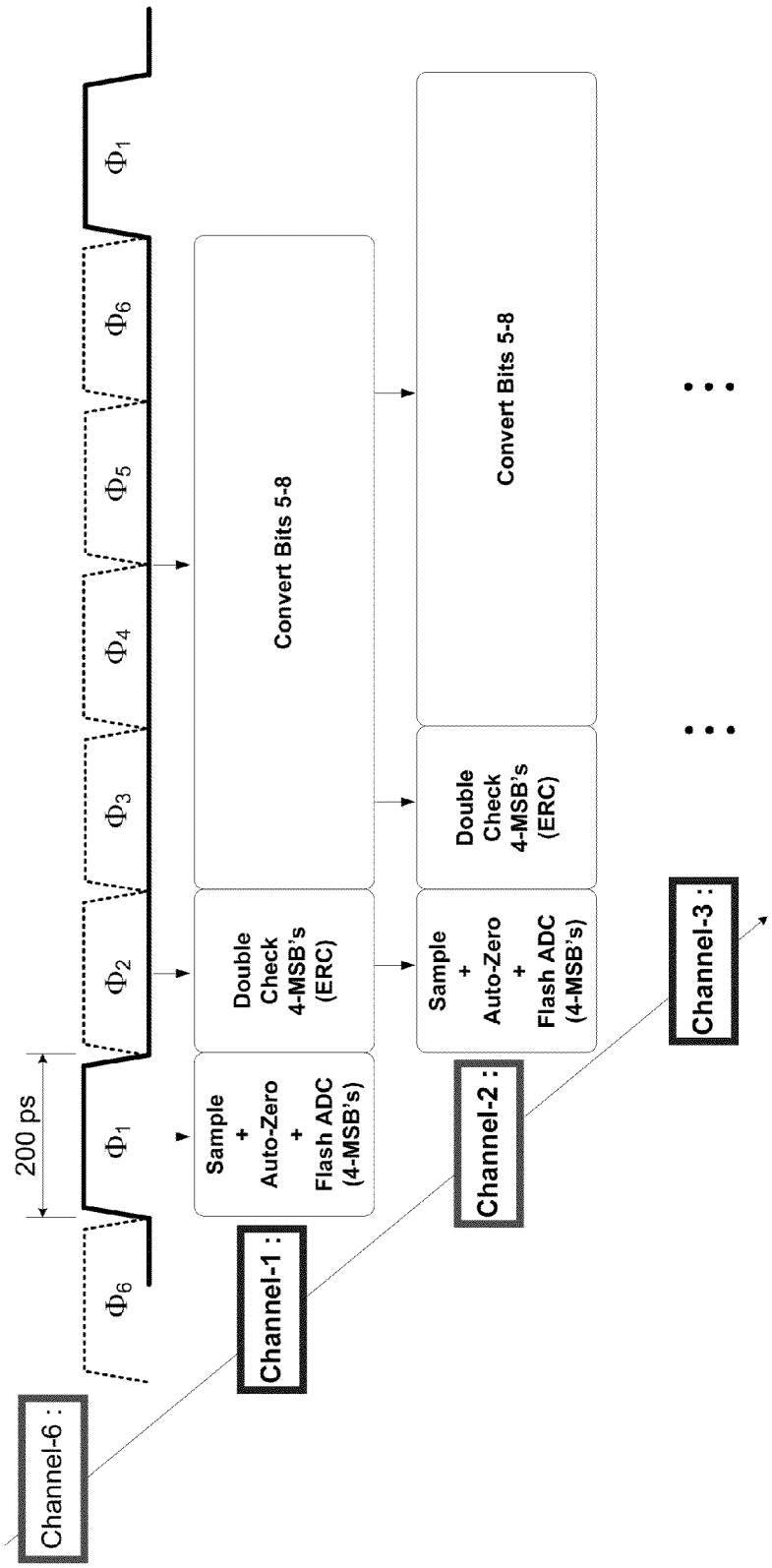
FIG. 3 is a simplified timing diagram illustrating ADC process performed by SAR channels according to embodiments of the present invention.

FIG. 3 is a simplified timing diagram illustrating ADC process performed by SAR channels according to embodiments of the present invention. This diagram is merely an example, which should not unduly limit the scope of the claims. One of ordinary skill in the art would recognize many variations, alternatives, and modifications. As shown in FIG. 3, each channel takes 6 phases to perform an 8-bit conversion. The conversion process is interleaved in time, thereby allowing the six channels to perform ADC in parallel. Sampling phase and flash ADC reading phase obtains data from component shared by the entire architecture: input 101 and the flash ADC 103, and thus the staggering of phases as shown in FIG. 3 is needed. For example, the SAR channel 1 (block 120C in FIG. 1), among other things, obtains analog sample from the input (e.g., value held by the capacitor 101) during the first phase, $\Phi_1$. During the same phase, $\Phi_1$, the flash ADC 103 performs conversion on the 4-MSBs, with the predetermined reference shift explained above. During phase 1, the SAR channel 1 also performs self offset calibration or "auto-zero", which removes random offset error associated with the comparator of the channel (e.g., non-zero voltage at the comparator input, etc.). AT the second phase, $\Phi_2$, error checking is performed. For example, the SAR channel 1 checks the 4-MSB received from the flash ADC 103 to see if there is any error. Since the MSB value conversion performed by the flash ADC 103 is associated with a predetermined "shift" of reference levels, the 4 MSBs from the flash ADC 103 is used both for error correction and ADC process itself, as the SAR does not have to perform ADC conversion of the 4 MSB, which would have required 4 additional phases. Bits 5-8 are converted at phases 3-6, or $\Phi_{3-6}$, as each bit requires a comparison with a reference voltage (e.g., a binary search process for the next bit). After the conversion for bits 5-8 is complete, at the end of phase 6, or $\Phi_6$, the SAR channel 1 is ready to perform the next conversion, which is for analog value number 7, while analog values 2-6 are already converted by SAR channels 2-6 respectively. Since the six SAR channels are performing ADC in parallel, the conversion rate remains constant meaning that during each phase the ADC system will take one analog input sample and generate one equivalent digital output sample. In the example shown in FIG. 3, each phase takes about 200 ps and an 8-bit output is ready in each phase (from different SAR channels), a throughput rate of 5 GHz is achieved. Depending on the implementation, the processing speed and the phase length can be changed accordingly. In addition, the number of phases and SAR channels can be changed depending on the specific application. For example, the flash ADC 103 can be configured to convert 6 bits, and only 4 SAR channels are needed for an 8 bit conversion (i.e., 4 phases for each SAR channel, 1 for sampling and zeroing, 1 for checking the 6 MSB, and 2 for bit conversion).

In various embodiments, the "shift" of the reference levels of the flash ADC 103 can be provided by either shifting (or biasing) the actual reference levels or by adding a constant positive or negative offset to the analog sample at the input of the flash ADC 103. That is, when the flash ADC 103 performs ADC conversion, the value of the analog sample has already been shifted to a known direction (i.e. increased or decreased by a constant and known value). This predetermined offset value (about ½ of the LSB converted by the flash ADC, and other values are possible as well) compensates for random errors of the flash ADC including noise and random offset of theflash comparators that may move randomly up or down. Typically, in a conventional ADC conversion process, an error correction process would require two comparison cycles (or phases): a first phase to determine whether the error had occurred and a second phase to detect the direction of the error and correct for it. In contrast, by incorporating the constant shift in Flash reference levels, the direction at which the errors can affect the output results is known, hence, it is to be appreciated that error correction against random errors can be accomplished in one clock cycle (e.g., during phase 2 of SAR channel 1, as shown in FIG. 3). This is because the amount of shift (e.g., ½ of LSB) is pre-selected and greater than the superposition of all possible random errors of the flash, and thus the direction at which the noise could affect the results is known. For example, the flash ADC 103 always converts to a value greater than the actual input if the shift in reference levels is negative; on the other hand, the flash ADC 103 always convert to a value less than the actual input if the shift is positive. In a preferred embodiment, a positive shift value is used, as digital addition is typically easier to implement than subtraction in case error correction had to be performed.

Now referring back to FIG. 1. After the initial 6 phases at the start of the ADC process, the ADC architecture is able to continuously provide an 8-bit reading every clock phase, each time from a different SAR channel. The multiplexer is configured to selectively read the digital output from the SAR channel that corresponds to the previous sampling phase. For example, SAR channel 1 is read at phase 1, SAR channel 2 is read at phase 2, and so on, where each reading corresponds to an analog value sampled during the previous phase-1 (or phase-2 and so on).

As explained, the ADC architecture (e.g., as shown in FIG. 1) can be implemented with various configurations for different applications. For example, a combination of 4-bit flash ADC and 6 SAR channels is one of the optimal configurations for low power consumption. For 8 bit conversion, a combination of 2-bit flash ADC and 8 SAR channels could be implemented as well, where the conversion would require 8 phases. While the 2-bit flash ADC and 8 SAR channels combination would work, the amount of hardware and the power consumption needed for the SAR channels would offset the saving gained by adding the flash ADC.

Figure 4:
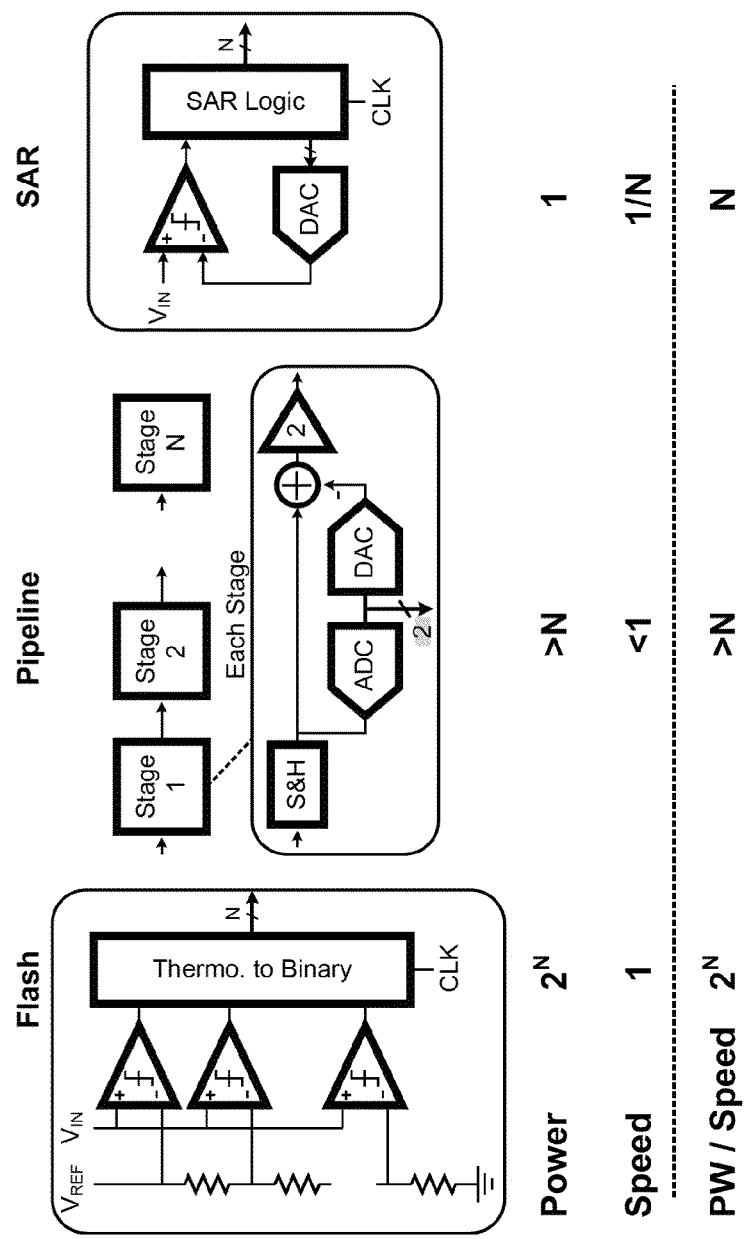
FIG. 4 is a simplified diagram illustrating a general ADC architecture according to embodiments of the present invention.

It is to be appreciated, as explained above, that ADC architecture illustrated in FIG. 1 only serves as an example. Depending on the application, other implementations are possible as well. FIG. 4 is a simplified diagram illustrating a general ADC architecture according to embodiments of the present invention. This diagram is merely an example, which should not unduly limit the scope of the claims. One of ordinary skill in the art would recognize many variations, alternatives, and modifications. For comparison purposes, FIG. 4 depicts three major classical ADC architectures namely Flash Architecture at the left, Pipeline Architecture at the middle, and Successive-Approximations (SAR) architecture at the right. The flash architecture comprises at least a parallel array of comparators that performs ADC at one clock cycle. The pipeline architecture comprises a series of cascaded lower-resolution flash converters combined with their corresponding residue DACs and residue amplifiers. The SAR architecture comprises a sample-and-hold, a comparator, successive-approximations (SAR) control logic and a corresponding SAR DAC for residue generation. The energy efficiency of these architectures can be compared by evaluating the power to speed ratio.

The power consumption of a flash ADC is roughly proportional to $2^N$ where N is the flash ADC resolution in bits. The amount of power consumed by the flash ADC is mainly attributed to the comparators, where the number of comparators needed increases geometrically as resolution (or number of bits) increases. The processing speed at the flash ADC stage is 1 sample per cycle, as the large number (i.e., $2^N$) of comparators allows conversion to be completed within 1 cycle. Hence the energy efficiency or the normalized power to speed ratio of the flash architecture is roughly $2^N$.

In the case of a SAR ADC, the power consumption is related to the power consumption of one comparator while the conversion latency depends on the resolution (or number of bits, N) processed. For example, an SAR channel needs at least N cycles to perform ADC on N bits, and thus the conversion speed becomes proportional to 1/N. The amount of power consumed by each SAR channel is 1 unit in a normalized sense (because it has only one comparator) because it converts only 1 bit at every clock phase/cycle. Therefore the energy efficiency or power to speed ratio in the case of a SAR ADC is N, which can be significantly lower than that of the flash converter depending on N. The energy efficiency of the pipeline architecture is usually a number greater than N, which falls in a range between the efficiencies of flash and SAR depending on the implementation method. The main problem of a SAR ADC is its low conversion speed of 1/N.

However to overcome this problem and provide a conversion speed similar to the flash, a plurality of SAR channels can be used in a time-interleaved fashion as illustrated in FIG. 1. Typically in a purely SAR based time-interleaved ADC structure for N bits of conversion, at least N number of SAR channels will be needed. Since a typical SAR requires at least one dedicated clock cycle for sampling the analog input, the number of conversion cycles is usually N+1 (i.e. one more cycle) and because of that a time-interleaved parallel SAR architecture needs N+1 channels for the full speed throughput rate of 1 output per cycle.

It is to be appreciated that for an 8-bit ADC system according to embodiments of the present invention, it can be optimal to implement the ADC architecture with a 4-bit flash ADC module and 6 SAR channels, where the power consumption is minimized for the full speed conversion rate (i.e., 1 conversion per cycle).

For the sake of power analysis and comparison, let's assume the total power consumption of the ADC with the proposed architecture is $P_T$, which for the purpose of determining minimal power consumption, can be expressed as a function of k, where k is the number of bits processed by the flash ADC, and n is the total number of bits converted and m is the number of parallel SAR channels needed, where m=n−k+2.

To perform ADC, both course resolution and fine resolution comparators are needed respectively in the Flash and SAR sub blocks. Because the resolution of flash is k bits, $2^k$ course compartors are used in the flash. Also the number of fine (i.e. low noise and low offset) comparators is equal to the number of SAR channels or m. Here, the power consumption of a coarse resolution comparator is expressed as $P_1$ and the power consumption of a fine resolution comparator is expressed as $P_2$. Often, $P_2$ is much larger than $P_1$, typically by a factor of 10. The ratio of $P_2/P_1$ can be expressed as α.

Since the comparators contribute to most of the power consumption of an ADC structure according to embodiments of the present invention the total power consumption can be expressed as:

$$P_T(k)=(2^k\times P_1)+(m\times P_2)=(2^k\times P_1)+[(n-k+2)\times P_1\times\alpha)]=P_1\times[2^k+\alpha\times(n-k+2)]$$

To determine a minimum of $P_T$ as a function of k, the following equation is used (by taking derivative of $P_T(k)$):

$$\frac{\partial P_T(k)}{\partial k}=0$$

Solving the equation above, to minimize $P_T(k)$, k is given by the following equation:

$$k=\log_2(\alpha)-\log_2(\ln 2)$$

As mentioned above, α can be around 10, in which k≈3.85, and when rounded to the nearest integer number, k is 4. Translated to the ADC implementation, a 4-bit flash with (8−4+2)=6 SAR channels is to be used. As can be seen, the specific implementation (i.e., flash ADC resolution v. number of SAR channels) depends on the number of bits k and the types of comparators used, among other factors.

FIG. 5 is a table illustrating the operation of an ADC system according to an embodiment of the present invention. This diagram is merely an example, which should not unduly limit the scope of the claims. One of ordinary skill in the art would recognize many variations, alternatives, and modifications. In FIG. 5, each row shows data at different modules during a single phase (or clock cycle); each column is for a type of module. For example, "S&H #1" is for sample and hold module (e.g., switch 121 and capacitor 106 in FIG. 1) that is configured to sample input value during odd phases. The "Flash A/D" column shows analog input values (Vin) and digital output value ("dig out") with a shifted offset of the 4 MSBs. The SAR #1 column shows analog input value ("Vin") and digital output value ("dig out"). It is to be noted that the analog input value at each point of time corresponds to the digital output value at 6 units of time later, as the analog input value is converted to digital output value after 6 cycles. The digital output, as described above, is an 8 bit value where the 4 MSBs are converted by the flash ADC and the 4 LSBs are converted by the SAR. The MUX column shows the digital output selected the multiplexer.

As an example, in row 1 that corresponds to phase 1 of the ADC conversion process, an analog value of "0.4155" is sampled, by the odd sample and hold, or "S&H #1", and the even sample and hold "S&H #2" does not have any value. The flash ADC at phase 1 also reads the value "0.4155", and outputs a digital conversion value "1011". The SAR #1, during phase 1, holds the sampled value of "0.4155". At phase 1 (or row 1 here), the digital output of the SAR #1 "11110111", which is output by the multiplexer, is not the converted value of "0.4115", but the converted value from previous cycle. The "0.4155" converted by the SAR #1 is read as a digital output of "10110101" in phase 7 (row 7). Note that the first four digits "1011" is from the flash ADC conversion at the first phase.

The error correction by the SAR, as explained above, is performed during the second phase of the corresponding SAR channel. For example, in row 2 (or phase 2), the digital output of the SAR #1 is "erc=0" (i.e., no error).

To illustrate, the flash ADC has an error during sample #6 (or phase 6, or row 6 in the table), where the value "0.2475" is converted to "1010". The SAR channel #6 detects this error in its second phase (or during phase 7), and outputs and "erc=1" that indicates the error. When the digital output during sample #12, the for MSB is corrected to "1001", wherein the error is compensated.

Similarly, other SAR channels take their turns performing conversion and error correction. The Flash ADC performs conversion on MSB in each phase, and its output is read by corresponding SAR channels.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A method of using an analog-to-digital conversion (ADC) system comprising for converting an analog signal to an n-bit digital signal, the method comprising providing the system comprising:
    a flash ADC module being configured to perform k-bit analog-to-digital conversion, k being less than n and greater than or equal to 2, the flash ADC module having a predetermined offset value;
    a first sampling module configured to sample the analog signal during m/2 odd phases associated with a first plurality of channels, m being equal to n−k+2, and m being rounded to the nearest even number towards positive infinity;
    a second sampling module configured to sample the analog signal during m/2 even phases associated with a second plurality of channels;
    a first plurality of m/2 channels configured to process the m/2 phases, each of the channels corresponding to an even phase and comprising a SAR logic unit, and a comparator, each channel is configured to perform error correction using the predetermined offset value;
    a second plurality of m/2 channels configured to process the m/2 phases, each of the channels corresponding to an odd phase and comprising a SAR logic unit, and a comparator, each channel is configured to perform error correction using the predetermined offset value; and
    using the system.

2. The method of claim 1 wherein the flash ADC module generates at least the MSB of the n-bit digital signal and the first plurality of module generates at least the LSB of the n-bit digital signal.

3. The method of claim 1 wherein each of the channels is configured to generates k bits of converted signal in k phases, the k bit including an LSB.

4. The method of claim 1 wherein each of the channels is further configured to perform zeroing and error correction in two phases.

5. The method of claim 1 further comprising multiplexer selectively reads data from the plurality of channels at their respective phases.

6. The method of claim 1 wherein each channel is configured zero the offset of the SAR comparator during a first phase of analog-to-digital conversion.

7. The method of claim 1 wherein each channel is configured to perform analog-to-digital conversion in k phases.

8. The method of claim 1 wherein the first sample module comprises a first capacitor for holding a sample value.

9. The method of claim 1 wherein each of the first plurality of channels comprises a capacitor for holding a sample value corresponding to the first sampling module.

10. The method of claim 1 wherein the first sampling module comprises a capacitor for sampling the analog signal.

11. The method of claim 10 wherein the first sampling module further comprising a buffer electrically coupled to the capacitor.

12. The method of claim 1 wherein each of the channels further comprising a Digital-to-Analog-Converter (DAC) unit.

13. The method of claim 1 wherein the flash ADC module is configured to process an analog sample value corresponding to the first sampling module during even phases.

14. The error correction of claim 13 wherein a correction is applied during the same phase to the digital output and analog equivalent of the digital output of the flash ADC.

15. The method of claim 1 wherein each channel of the first and second plurality of channels is configured to correct the potential errors of the k-bit flash ADC during a second phase of analog-to-digital conversion.

16. In a data communication system, a method for converting an analog signal to an n-bit digital signals, method comprising:
    sampling the analog signal during a first phase by a first sampling module;
    sampling the analog signal during a second phase by a second sampling module;
    generating a first set of k MSBs by a flash ADC module during the first phase;
    generating a second set of k MSBs by the flash ADC during the second phase;
    re-sampling the analog signal during the first phase by a first SAR channel;

performing error correction using the re-sampled analog signal and the first set of k MSBs by the first SAR channel during the second phase;

converting n–k LSBs by the first SAR during n–k phases following the second phase;

re sampling the analog signal during the second phase by a second SAR channel;

performing error correction using the analog signal and the second set of k MSBs by the second SAR channel during a third phase;

converting n–k LSBs by the second SAR during n–k phases following the third phase;

outputting a first n bit digital conversion generated by the first SAR during the first phase; and outputting a second n bit digital conversion generated by the second SAR during the second phase.

17. In a data communication system, a method of using an analog-to-digital conversion (ADC) system comprising for converting analog signals to an n-bit digital signals, the system comprising:

a clock module configured to generate clock cycle signals at a substantially constant rate of at least 100 MHz, the system being configured to operate alternating odd and even phases, the odd and even phases being controlled by the clock cycle signals;

a first sampling module for sampling the analog signals during odd phases;

a second sampling module for sampling the analog signals during even phases;

a flash ADC module configured to convert k MSBs of n-bit digital signals within each phase;

a first plurality of SAR channels configured to convert the analog signals into n–k LSBs of the n-bit digital signals during the odd phases; and a second plurality of SAR channels configured to convert the analog signals into n–k LSBs of the n-bit digital signals during the even phases; and using the n-bit digital signals.

18. The method of claim 17 wherein each of the first plurality of SAR channels is configured to:

perform auto-zeroing during a first cycle;

perform error detection and correction on the k MSBs converted by the flash ADC module at the first cycle during a second cycle.

* * * * *